United States Patent [19]

McDavid

[11] Patent Number: 5,040,052

[45] Date of Patent: Aug. 13, 1991

[54] COMPACT SILICON MODULE FOR HIGH DENSITY INTEGRATED CIRCUITS

[75] Inventor: James M. McDavid, Dallas, Tex.

[73] Assignee: Texas Instruments Incorporated, Dallas, Tex.

[21] Appl. No.: 405,088

[22] Filed: Sep. 6, 1989

Related U.S. Application Data

[63] Continuation of Ser. No. 138,227, Dec. 28, 1987, abandoned.

[51] Int. Cl.[5] .......... H01L 39/02

[52] U.S. Cl. .......... 357/80; 357/74; 361/414

[58] Field of Search .......... 357/74, 80, 71, 81; 361/396, 386, 388, 389, 412, 413, 414; 174/16.3; 165/185

[56] References Cited

U.S. PATENT DOCUMENTS

| | | | |
|---|---|---|---|
| 3,300,686 | 1/1967 | Johnson et al. | 361/414 |
| 3,312,878 | 4/1967 | Poch et al. | 361/414 |
| 3,372,309 | 3/1968 | Stockdale | 361/414 |
| 3,437,882 | 4/1969 | Cayzer | 361/414 |
| 4,074,342 | 2/1978 | Honn et al. | 357/68 |
| 4,225,900 | 9/1980 | Ciccio et al. | 357/80 |
| 4,398,208 | 8/1983 | Murano et al. | 357/80 |
| 4,500,905 | 2/1985 | Shibata | 357/68 |
| 4,698,662 | 10/1987 | Young et al. | 357/80 |
| 4,706,166 | 11/1987 | Go | 361/403 |
| 4,774,632 | 9/1988 | Neugebauer | 357/74 |
| 4,825,284 | 4/1989 | Soga et al. | 357/82 |
| 4,922,378 | 5/1990 | Malhi et al. | 357/75 |

FOREIGN PATENT DOCUMENTS

| | | | |
|---|---|---|---|
| 59-74690 | 4/1984 | Japan | 357/74 |

OTHER PUBLICATIONS

Crawford et al., IBM Technical Disclosure Bulletin, vol. 20, No. 11B, Apr. 1978, pp. 4771-4773, "High Density Multilayer Ceramic Module".

*Primary Examiner*—Rolf Hille
*Assistant Examiner*—Hoanganh Le
*Attorney, Agent, or Firm*—B. Peter Barndt; James T. Comfort; Melvin Sharp

[57] ABSTRACT

A semiconductor module that densely packs integrated circuit chips to provide electronic systems or large memory modules in an array of stacked silicon boards. The semiconductor chips may be flip mounted and the back side of each chip is in thermal contact with an adjacent silicon board to provide heat conduction away from the chip.

7 Claims, 3 Drawing Sheets

COMPACT SILICON MODULE FOR HIGH DENSITY INTEGRATED CIRCUITS

This application is a continuation of application Ser. No. 07/138,227, filed 12/28/87, abandoned.

FIELD OF THE INVENTION

The invention relates to integrated circuits, and more particularly to methods and apparatus for producing a compact module of integrated circuits mounted on stacked silicon substrates.

BACKGROUND OF THE INVENTION

Advances in semiconductor technology are placing demands on higher level system packaging. Monolithic integrated circuit technology has been a driving force behind electronics growth. It is therefore logical to look to integrated circuit techniques for system level packaging.

While substantial innovations have been made in packaging semiconductor components and devices, there is a need for more efficient and economical packaging techniques. Miniaturization and thermal dissipation characteristics of presently available packaging are not fully adequate to take advantage of inherent performance characteristics of current devices.

With the emergence of very large scale integrated (VLSI) circuits, it becomes necessary for system integration development to package such circuits together so as not to compromise the advancements in circuit integration. VLSI circuits, such as one megabit random access memory circuits, are packaged in a plastic or ceramic encapsulant and are available in either as a dual in-line package, or as a leadless chip carrier. Both of these approaches address the packaging problems of single integrated circuit chips, but do not present solutions to system integrated and/or packaging of multiple chips.

Hybrid wafer packaging technology has been used to flip-chip mount semiconductor chips on substrates or by vertically mounting the semiconductor chips on the substrate. The signal and power terminals of the semiconductor are used to mount the chip when flip-chip methods are used, and the terminals are along one side of the chip when the chips are vertically mounted. These methods increase the density of components that may be placed in a single package, but do not necessary deal with substrate contact, heat transfer, and other problems.

From the foregoing it may be seen that a need exists for an innovative system integration, or packaging technique to complement the corresponding advances in the miniaturization of device technology. There is an associated need for new packaging apparatus and techniques for integrating together multiple integrated circuit chips in a three dimensional manner so as to provide a highly efficient, economical and compact arrangement, while yet providing adequate thermal dissipation required for densely packed electrical circuits.

BRIEF DESCRIPTION OF THE INVENTION

The invention is to the method and apparatus for packaging, for example, 1 megabit (Mb) DRAMs together to provide a large memory. For example, 16 boards with 72 1Mb DRAMs each are stacked to provide a compact package. This includes 1 parity bit for each byte. The DRAMs are flip-chip mounted on the boards. The boards are silicon transmission-line boards using thick film technology. Each board could be, for example, 40 mils thick. The use of silicon boards eliminates thermal expansion mismatches. Heat conduction is through the back side of each chip. The chips are mounted upside-down with the bottoms of the chips contacting the silicon interconnection board lying above the chips. This is in contrast to heat conduction through solder contacts as is commonly done in flip-chip devices.

Electrical contact to the backside of the chips is also provided. Backside electrical contact is important for transient suppression to avoid latch up in CMOS circuits, and for soft error suppression in memory circuits. Such contact is not easily obtained in other hybrid packaging approaches.

If additional heat transfer means were necessary, liquid cooling plates could be used in the stack of boards and the thickness of each silicon board could be reduced.

Each of the stacked boards is connected to an edge connect board that interfaces with each of the stacked boards and to any system in which the memory stack is used. Alternatively, connection between stacked boards could be accomplished by holes near the edge of each of the stacked boards.

The technical advance represented by the invention as well as the objects thereof will become apparent from the following description of a preferred embodiment of the invention when considered in conjunction with the accompanying drawings, and the novel features set forth in the appended claims.

BRIEF DESCRIPTION OF THE DRAWINGS

FIG. 5 is an isometric drawing of the invention showing stacked memory boards connected to an edge interconnect board, and having cooling interleave boards in the stack.

DESCRIPTION OF A PREFERRED EMBODIMENT

Figure 1:
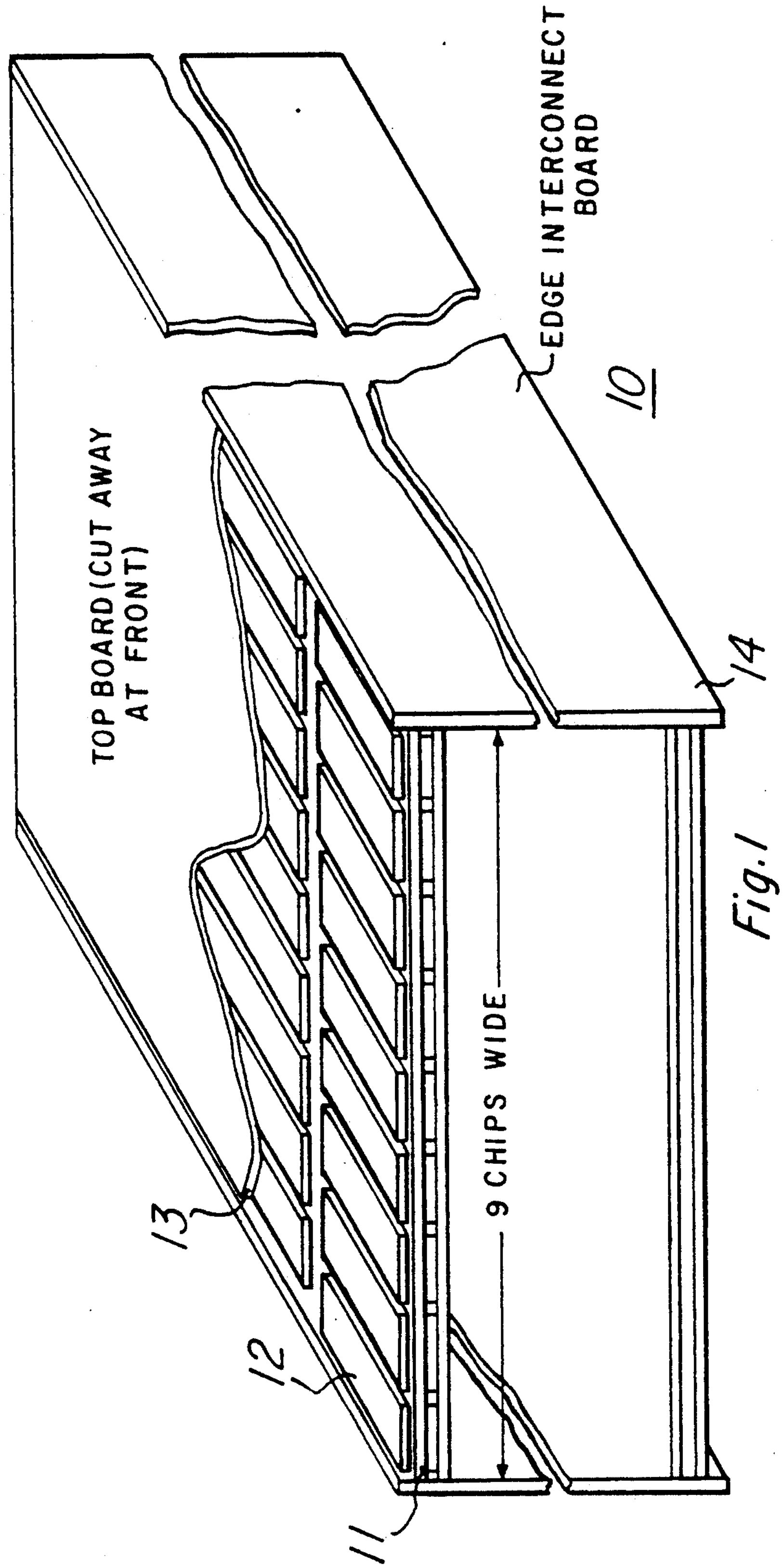
FIG. 1 an isometric view of a memory package of the present invention.

FIG. 1 illustrates memory module according to the present invention. The module 10 is made up of a plurality of stacked interconnection boards 11. Each board has an array of memory devices 12, for example 1 Mb DRAMS mounted on the board. To make a 128 Mbyte (1.152 Gbit including parity bits) module there would be 16 stacked boards 11 with 72 1 Mb DRAMS each. The DRAMS are flip-chip mounted so that the contact areas are of the DRAMS 112 are electrically attached to board 11.

The boards are cut from a silicon waffer and are transmission-line boards fabricated using thick film technology. The board may be, for example, 40 mils thick, and are used as a mount base for the DRAMS, and to interconnect the DRAMS as needed to form the memory module. Each board is also connected to an edge interconnect board 14. Edge connect board is used as the input/out interface for the memory module.

Boards 11 are laid flat and stacked in the memory module 10 with no space between layers. Heat conduction is though the back of each DRAM to the board 11 above it. Backside electrical contact to the chip substrate is also made through board 11 above it.

Since the boards 11 are stacked without space between them, one surface of each board is in contact the DRAMS mounted on the board below it. In this manner each board 11 provides heat transfer and substrate electrical contact for the DRAMS mounted on the board mounted below it.

The edge connector board is orthogonal, standing vertically at one side of the stacked boards 11. A cover board, for example board 13, would provide contact to the top memory board. An additional system board could be included in the stack for error correction and control devices and circuitry if needed.

Additional interleave layers (See FIG. 5) may be added to the module of FIG. 1, if desired, to provide cooling plates if additional cooling if needed.

Figure 2:
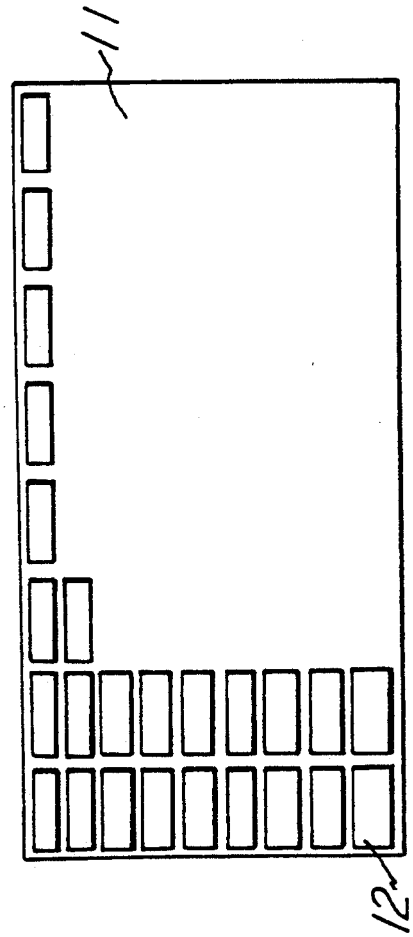
FIG. 2 illustrates one memory board from the memory package of FIG. 1.

A single board is illustrate in FIG. 2. Each board 11 has a rectangular array of memory devices 12 thereon. In the example shown in FIG. 2, there could be as many as 72 memory chips on board 11.

Figure 3:
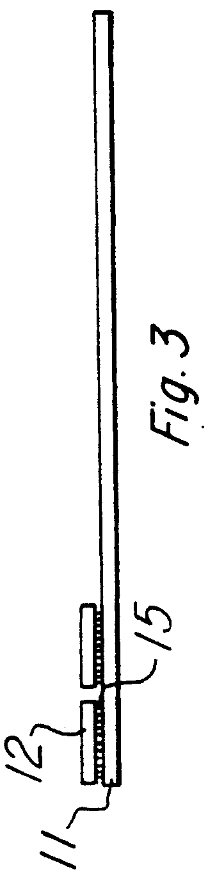
FIG. 3 is a side view of the memory board of FIG. 3.

In FIG. 3, a side view of board 11 is illustrated. Memory devices 12 are flip-chip mounted by bonding the contact pads 15 of memory device 12 to the appropriate circuitry (not illustrated) on board 11.

Figure 4:
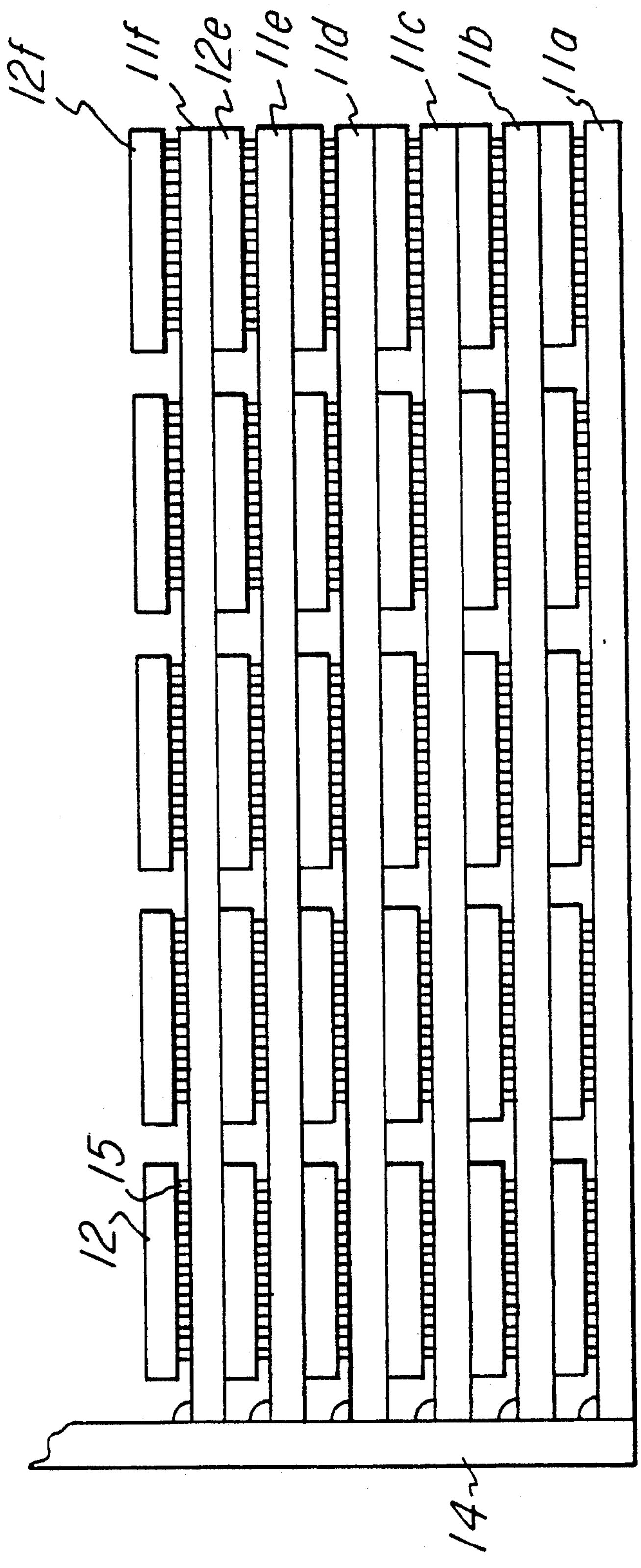
FIG. 4 is a side view of several stacked memory board connected to an edge interconnect board.

FIG. 4 is a side view, in part, of the the memory module of FIG. 1. A plurality of boards 11*a* through 11*f* are vertically stacked and connected to edge interconnection board 14. An array of memory devices 12 are mounted on each board 11 and bonded to and electrically connected to the board and the circuitry thereon through connection pads 15.

Each memory device 12 is in contact with the board 11 above it. For example, each memory device 12*e* is mounted on board 11*e* and is in heat conductive contact with board 11*f*. There is also electrical contact through board 11*f* to the backside of the chips 12*e* on board 11*e*.

The memory chips on the top board 11*f* do not have another board with memory chips above it, but a cover board, such as board 13, FIG. 1, is used to enclosed the module and to provide a heat sink and substrate electrical contact for the memory chips on the top board. An additional board may also have error correction and control circuitry and devices thereon and be included in the stack.

FIG. 5 is an isometric view of a stacked array of memory boards. There are a plurality of memory chips 32 mounted on interconnection boards 31. Boards 31 are stacked such that each semiconductor memory device 32 is in contact with the board on which it is mounted and also the adjacent board. Each of the interconnection boards are mounted on and connected to edge interconnect board 24. Circuit interconnections, for example 41, 42 and 43, and contacts 21 interconnect the interconnection boards 31 with the edge interconnect board 24.

There may also be included in the stacked interconnection boards one or more additional interleave layers, for example layers 30 and 35 to provide cooling plates, if additional cooling is need to transfer heat away from the memory devices. Each of the interconnection boards may have input/output circuitry such as contacts 21 connecting the interconnection boards and the memory devices thereon with circuitry on the edge interconnect board, for example, interconnections designated as 41, 42 and 43.

What is claimed is:

1. An electronic system module including a plurality of semiconductor memory devices mounted on stacked interconnection boards having interconnection circuitry on at least one surface of the interconnection board, said interconnection circuitry extending to at least one edge of the interconnection board, comprising:

a plurality of said interconnection boards vertically stacked;

an edge interconnection board having interconnection circuitry thereon, said stacked interconnection boards mounted on the edge interconnected board at said at least one edge of the interconnection board; a input/output circuitry on said edge interconnection board and said edge interconnection board and the interconnection circuitry thereon connected to said stacked interconnection boards and the interconnection circuitry thereon to interconnect the memory devices, and to provide in conjunction with said input/output circuitry, an input/output to and from said electronic system module, said vertically stacked boards being stacked with no space between the memory devices on one interconnection board and the adjacent interconnection board.

2. The electronic system module according to claim 1, wherein the semiconductor devices on the interconnection board are in thermal contact with an adjacent interconnection board.

3. The electronic system module according to claim 1, wherein said interconnection boards and said edge interconnection board are silicon.

4. The electronic system module according to claim 1, wherein the semiconductor memory devices on one interconnection board are in electrical contact with an adjacent interconnection board.

5. The electronic system module according to claim 1, wherein the interconnecting boards have interconnections thereon, the interconnections being formed from a thick film, the thick film being constructed using thick film technology.

6. The electronic system module according to claim 1 wherein each semiconductor device backside is in thermal contact with the interconnection board adjacent to and stacked against it.

7. The electronic system module according to claim 1, including interleaved cooling plates between at least some of the interconnection boards.

* * * * *